US 6,541,320 B2

(12) United States Patent
Brown et al.

(10) Patent No.: US 6,541,320 B2
(45) Date of Patent: Apr. 1, 2003

(54) METHOD TO CONTROLLABLY FORM NOTCHED POLYSILICON GATE STRUCTURES

(75) Inventors: Jeffrey Brown, Fishkill, NY (US); Richard Wise, New Windsor, NY (US); Hongwen Yan, Somers, NY (US); Qingyun Yang, Hopewell Junction, NY (US); Chienfan Yu, Highland Mills, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/928,210

(22) Filed: Aug. 10, 2001

(65) Prior Publication Data

US 2003/0032225 A1 Feb. 13, 2003

(51) Int. Cl.[7] .................. H01L 21/336; H01L 21/8238; H01L 21/3205; H01L 21/302
(52) U.S. Cl. ........................ 438/197; 438/199; 438/286; 438/595; 438/596; 438/705; 438/735
(58) Field of Search ................................. 438/197, 199, 438/286, 595, 596, 410, 62, 735, 705

(56) References Cited

U.S. PATENT DOCUMENTS

| 4,403,396 | A |   | 9/1983  | Stein et al. |          |
|-----------|---|---|---------|--------------|----------|
| 4,689,869 | A |   | 9/1987  | Jambotkar et al. |      |
| 5,034,791 | A |   | 7/1991  | Kameyama et al. |       |
| 5,053,849 | A |   | 10/1991 | Izawa et al. |          |
| 5,286,665 | A |   | 2/1994  | Muragishi et al. |      |
| 5,405,787 | A |   | 4/1995  | Kurimoto     |          |
| 5,545,578 | A | * | 8/1996  | Park et al.  | 438/303  |
| 5,547,883 | A |   | 8/1996  | Kim          |          |
| 5,751,048 | A |   | 5/1998  | Lee et al.   |          |
| 5,866,473 | A |   | 2/1999  | Xiang et al. |          |
| 5,895,273 | A |   | 4/1999  | Burns et al. |          |
| 5,960,270 | A | * | 9/1999  | Misra et al. | 438/197  |

(List continued on next page.)

FOREIGN PATENT DOCUMENTS

| EP | 0600437 A2    | * | 6/1994  |
|----|---------------|---|---------|
| EP | 0862222 A1    | * | 9/1998  |
| JP | 58201333 A    | * | 11/1983 |
| JP | 405144936 A   | * | 6/1993  |
| JP | 10092794 A    | * | 4/1998  |
| WO | WO 00/34984   |   | 6/2000  |

OTHER PUBLICATIONS

Ghani, et al., Portland Technology Development, QRE, TCAD, Intel Corporation, 100 nm Gate Length High Performance/Low Power CMOS Transistor Structure, vol. IEDM 99–415, IEEE (1999).

Primary Examiner—Matthew Smith
Assistant Examiner—Chuong A Luu

(57) ABSTRACT

A method and structure for forming a notched gate structure having a gate conductor layer on a gate dielectric layer. The gate conductor layer has a first thickness. The inventive method includes patterning a mask over the gate conductor layer, etching the gate conductor layer in regions not protected by the mask to a reduced thickness, (the reduced thickness being less than the first thickness), depositing a passivating film over the gate conductor layer, etching the passivating film to remove the passivating film from horizontal portions of the gate conductor layer (using an anisotropic etch), selectively etching the gate conductor layer to remove the gate conductor layer from all regions not protected by the mask or the passivating film. This forms undercut notches within the gate conductor layer at corner locations where the gate conductor meets the gate dielectric layer. The passivating film comprises a C-containing film, a Si-containing film, a Si—C-containing film or combinations thereof.

24 Claims, 3 Drawing Sheets

U.S. PATENT DOCUMENTS

| | | | |
|---|---|---|---|
| 5,963,789 A | * 10/1999 | Tsuchiaki | 438/62 |
| 6,011,290 A | 1/2000 | Gardner et al. | |
| 6,017,826 A | 1/2000 | Zhou et al. | |
| 6,037,630 A | 3/2000 | Igarashi et al. | |
| 6,060,733 A | 5/2000 | Gardner et al. | |
| 6,110,785 A | 8/2000 | Spikes, Jr. et al. | |
| 6,204,133 B1 | * 3/2001 | Yu et al. | 438/299 |
| 6,303,479 B1 | * 10/2001 | Snyder | 438/581 |
| 6,326,250 B1 | * 12/2001 | Ahmad et al. | 438/197 |
| 6,352,885 B1 | * 3/2002 | Wieczorek et al. | 438/197 |
| 6,383,937 B1 | * 5/2002 | Tseng | 438/705 |
| 6,399,469 B1 | * 6/2002 | Yu | 438/595 |
| 6,417,084 B1 | * 7/2002 | Singh et al. | 438/585 |

* cited by examiner

METHOD TO CONTROLLABLY FORM NOTCHED POLYSILICON GATE STRUCTURES

BACKGROUND OF THE INVENTION

1. Field of the Invention

The present invention relates to semiconductor device manufacturing, and more particularly to a method that controllably forms in-situ notched gate structures.

2. Background of the Invention

In the semiconductor industry, complementary metal oxide semiconductor (CMOS) devices such as metal oxide semiconductor field effect transistors (MOSFETs) are consistently required to be made smaller and smaller to meet expected performance improvements. An important size measurement of such transistors is the gate length. As the gate length decreases, other portions of the device must correspondingly decrease in size to match the size (e.g., to scale in size) of the gate length. It is also desirable to reduce the gate length more aggressively than can be achieved using the highest level of available lithography. Typically, MOSFETs having a sub 0.05 micron electrical critical dimension are presently desirable.

One advance that allows the gate length of a MOSFET to be reduced beyond the smallest feature size available in current lithography is to notch the bottom portion of the gate conductor material, e.g., polysilicon. Notched gates reduce the gate length dimension at the gate conductor/gate dielectric interface thereby improving device performance, yet the notched gates do not require the remainder of the device to suffer a similar reduction in scale. However, notching of the lower portion of the gate with prior art processes is problematic in several cases.

FIG. 1 illustrates a typical prior art notched gate structure. Specifically, the structure shown in FIG. 1 comprises semiconductor substrate 10, a layer of gate dielectric 12 formed on a surface of semiconductor substrate 10, and patterned notched gate region 14 formed on a portion on gate dielectric 12. The patterned notched gate region includes gate material 16 having notches 18 formed in a lower portion thereof and dielectric mask 20 formed atop gate material 16. In the present case, gate material 16 is comprised of polysilicon.

The notching at the base of the gate material shown in FIG. 1 depends strongly on the 10 combination of: (i) the charging of both dielectric mask 20 and gate dielectric 12, (ii) the anisotropic, i.e., ion-driven, etching agent, and (iii) the high sputter yield of the polysilicon gate material. More specifically, incoming ions (labeled as 22 in FIG. 1) curve towards the base of gate material 16 to create notches 18. Ions 22 are deflected by the static charge on dielectric mask 20 which has a negative charge due to thermal electron distribution. In addition, gate dielectric 12 has a positive charge due to anisotropic ion distribution, which attracts deflected ions back toward the lower corners of gate material 16. This selective charging leads to both a high sputter yield of silicon as well as removal of the sidewall passivant, allowing chlorine radicals to attack gate material 16 and create notches 18.

However, with such processing, the notch profile is uncontrollable and depends strongly on the relative charging of both dielectric mask 20 and gate dielectric 12, the incoming ion flux 22, the radical flux at the base, the doping level of the polysilicon gate material, as well as several other factors. It is impossible to simultaneously control all of these factors in current plasma based etching systems, and hence formation of notch 18 by this mechanism can lead to an unacceptably wide variation in device performance.

In view of the drawbacks mentioned hereinabove, there is a continued need for providing a new and improved method of forming a notched gate structure that is more reliable than the current state of the art.

SUMMARY OF THE INVENTION

One object of the present invention is to provide a MOSFET device in which the gate region has feature sizes that are below those that can be obtained from conventional lithography, i.e., sub 0.05 micron electrical critical dimension.

A further object of the present invention is to provide a method of controllably forming a notched gate structure which avoids the drawbacks that are associated with prior art processes of fabricating notched gate structures.

A yet further object of the present invention is to provide a method of fabricating a notched gate structure which utilizes processing steps that are compatible with existing CMOS processing steps.

A still further object of the present invention is to provide a method of fabricating a notched gate structure in which the gate electrical critical dimension (CD) is substantially reduced so as to improve the performance of the device.

An even further object of the present invention is to provide a method of fabricating a notched gate structure in which the total gate capacitance, as determined by the contact length of the gate across the gate dielectric, is reduced below values that can be obtained using current lithographic processes. In particular, it is desired to reduce the gate length more aggressively than the scale of the available gate structures (determined by available lithography).

These and other objects and advantages are achieved in the present invention by utilizing a unique, controllable, in-situ method of defining a notched gate region wherein a C-containing and/or Si-containing passivating film is employed to protect portions of the gate region during notch formation. The inventive method additionally affords cost and performance improvements over existing prior art processes for notching a gate.

Specifically, the method of the present invention, which is employed in controllably forming an in-situ notched gate structure, comprises the steps of:

(a) forming a gate conductor layer having a first thickness on a surface of a gate dielectric;

(b) forming a patterned mask over a portion of said gate conductor layer;

(c) etching said gate conductor layer in regions not protected by said patterned mask to a reduced thickness, wherein said reduced thickness is less than said first thickness;

(d) forming a passivating film over at least exposed vertical portions of said gate conductor layer, said passivating film comprises a C-containing film, a Si-containing film, a Si—C-containing film or combinations thereof; and (e) etching said gate conductor layer having reduced thickness and said conductor layer protected by said patterned mask to form undercut notches within said gate conductor layer at lower corners of said gate conductor layer that is beneath said patterned mask.

DETAILED DESCRIPTION OF THE INVENTION

Figure 1:
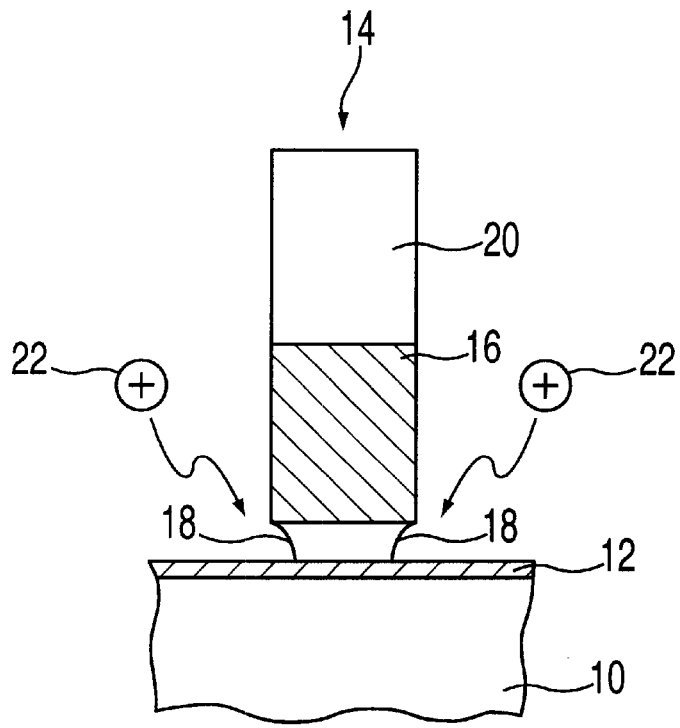
FIG. 1 is a pictorial representation of a prior art notched gate structure showing the induced charging of the dielectric mask and gate dielectric.

The present invention, which provides an in-situ method of controllably forming notched gate structures, will now be described in greater detail by referring to the drawings that accompany the present application. It is noted that in the accompanying drawings, like and/or corresponding elements are referred to by like reference numerals.

Figure 2A:
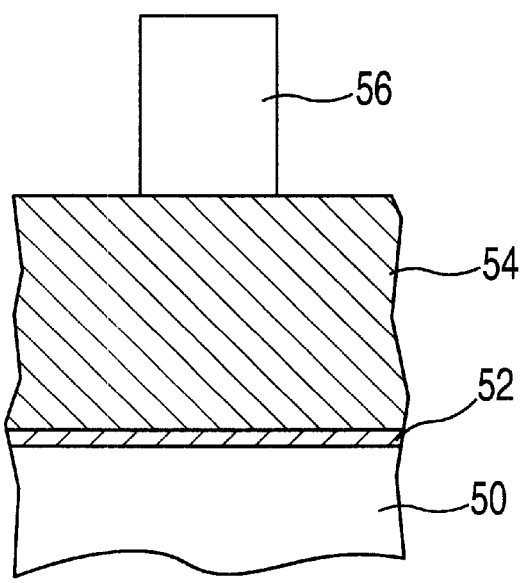
FIGS. 2A–E are pictorial representations (through cross-sectional views) showing the formation of a notched gate structure utilizing the method of the present invention.

Reference is first made to FIG. 2A which shows an initial structure that is employed in the present invention. Specifically, the initial structure shown in FIG. 2A comprises semiconductor substrate 50, gate dielectric 52 formed on a surface of semiconductor 50, gate conductor layer 54 formed on a surface of the gate dielectric layer, and patterned mask 56 formed on a portion of gate conductor layer 54.

The structure shown in FIG. 2A is comprised of conventional materials that are well known in the art and conventional processes that are also well known in the art are employed in fabricating the same. For example, semiconductor substrate 50 comprises any semiconducting material including, but not limited to: Si, Ge, SiGe, GaAs, InAs, InP and all other III/V compound semiconductors. Layered semiconductors comprising the same or different semiconducting material such as Si/Si, Si/SiGe and silicon-on-insulators (SOIs) may also be employed in the present invention as substrate 50. Semiconductor substrate 50 may be undoped or doped with an n or p-type dopant depending on the type of device to be fabricated.

The substrate may include various isolation regions such as shallow trench isolation (STI) regions or local oxidation of silicon (LOCOS) isolation regions formed in the surface thereof. For clarity, the drawings of the present invention do not specifically show the presence of the isolation regions; however, reference numeral 50 is meant to include those regions. One highly preferred semiconductor substrate employed in the present invention is a substrate that is comprised of Si.

Gate dielectric layer 52 is then formed on a surface of substrate 50 utilizing a conventional deposition process such as chemical vapor deposition (CVD), plasma-assisted CVD, atomic layer CVD, evaporation, sputtering and chemical solution deposition. Alternatively, the gate dielectric layer may be formed by a thermal oxidation, nitridation or oxynitridation process.

Gate dielectric layer 52 is comprised of a conventional dielectric material including, but not limited to: oxides, nitrides, oxynitrides and mixtures or multilayers thereof. A highly preferred dielectric material that is employed in the present invention as gate dielectric layer 52 is $SiO_2$. Note that the dielectrics employed in the present invention may have a higher or lower dielectric constant, k, than $SiO_2$. In one preferred embodiment of the present invention, high-k dielectrics such as perovskite-type oxides are employed as gate dielectric layer 52.

The physical thickness of gate dielectric layer 52 may vary, but typically the gate dielectric layer has a thickness of from about 0.5 to about 20 nm, with a thickness of from about 1.0 to about 10 nm being more highly preferred.

After forming the gate dielectric layer on a surface of the substrate, gate conductor layer 54 is formed on a surface of gate dielectric layer 52. The gate conductor layer may be composed of any conventional conductive material including, but not limited to: elemental metals such as W, Pt, Pd, Ru, Re, Ir, Ta, Mo or combinations and multilayers thereof; silicides and nitrides of the foregoing elemental metals; doped or undoped polysilicon and combinations or multilayers thereof. Alloys of the aforesaid elemental metals are also contemplated herein. One highly preferred conductive material employed as gate conductor layer 54 is doped polysilicon.

Gate conductor layer 54 is formed utilizing a conventional deposition process such as CVD, plasma-assisted CVD, sputtering, evaporation, chemical solution deposition and plating. When metal suicides are employed, a conventional silicidation process may be employed in forming the same. On the other hand, when doped polysilicon is employed as gate conductor layer 54, the doped polysilicon may be formed by an in-situ doping deposition process, or alternatively a layer of undoped polysilicon is first deposited and thereafter conventional ion implantation is employed in doping the layer of polysilicon.

The physical thickness of gate conductor layer 54 formed in the present invention may vary depending on the conductive material employed as well as the process used in forming the same. Typically, however, gate conductor layer 54 has a thickness of from about 20 to about 400 nm, with a thickness of from about 50 to about 200 nm being more highly preferred.

A mask material is then formed on the gate conductor layer and thereafter the mask material is subjected to a conventional lithography process and etching so as to provide patterned mask 56 on a portion of the gate conductor layer. The patterned mask protects underlying layers from subsequent etching processes and is used in defining the gate region, i.e., conductive feature, of the inventive structure.

In accordance with the present invention, the mask material includes any conventional dielectric material such as an oxide, nitride, oxynitride and combinations or multilayers thereof which is applied and patterned using conventional processing steps well known in the art. For example, the dielectric mask material may be applied by utilizing a conventional deposition process such as CVD, plasma-assisted CVD, evaporation, chemical solution deposition and other like deposition processes. Alternatively, a conventional thermal growing process may be employed in forming the dielectric mask material.

Following application of the dielectric mask material, a layer of photoresist (not shown) is then formed on the mask material and that structure is subjected to conventional lithography which includes exposing the layer of photoresist to a pattern of radiation, developing the pattern by utilizing an appropriate developer solution, and transferring the pattern to the underlying mask material via a conventional dry etching process such as reactive-ion etching.

In an alternative embodiment of the present invention, patterned mask 56 is a conventional photoresist material that is patterned via lithography.

It is noted that although the drawings depict the formation of one masked region on the conductive layer, the present invention works when more than one masked region is formed on the conductive layer. Thus, the present invention is capable of forming a plurality of notched gates having substantially vertical sidewalls and gate electrical critical dimensions of about 0.05 micron or less.

In some embodiments of the present invention, native oxide (not shown) forms on the exposed surface of gate conductor layer 54. This native oxide is typically formed when the structure is exposed to air. Note that under optimal vacuum conditions, the native oxide layer may no t be formed on t he exposed surface of the gate conductor layer.

In embodiments wherein a native oxide is present, a conventional etching process such as a low-pressure chlorine-containing plasma with a high wafer-biased power is used to remove the native oxide layer present on top of the conductive layer. The role of the high wafer-biased power is to increase the ion bombardment energy impacting the wafer surface to improve the removal efficiency of the native oxide layer.

Following formation of the patterned mask on a portion of the conductive layer and removal of the native oxide, the structure is then subjected to an anisotropic etching step in which the gate conductor layer not protected by the mask is thinned to a predetermined thickness. That is, this step of the present invention serves to reduce the initial thickness of exposed gate conductor layer, to a thickness which is less than the initial thickness. Moreover, this anisotropic etching step also forms a conductive feature underlying the mask. In accordance with the present invention, the conductive feature formed in the present invention at this point of the inventive method has substantially vertical sidewalls. The structure containing thinned conductive layer 54' and conductive feature 54" having substantially vertical sidewalls 58 is shown, for example, in FIG. 2B. Note that the conductive feature includes the masked portion of gate conductor layer 54.

Figure 2B:
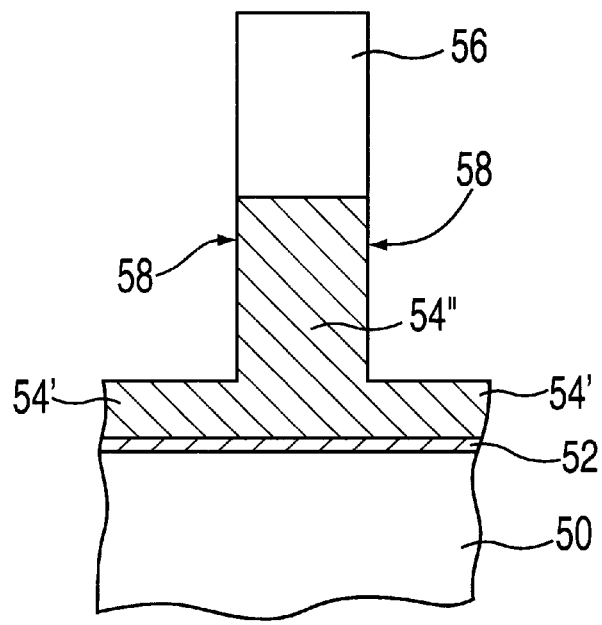

The anisotropic etching process used in this step of the present invention, which partially removes the conductive layer not protected by mask 56, includes any anisotropic etching process that can form the structure illustrated in FIG. 2B. Typically, this anisotropic etching step includes the use of a halogen-containing plasma. An example of a preferred anisotropic etching process that is employed in the present invention is a low-pressure (e.g., pressure of about 10 mTorr or less) $HBr/O_2$ plasma. Other suitable plasmas that may be used in this anisotropic etching step include, but are not limited to: fluorine-containing plasmas or chlorine-containing plasmas.

Figure 2C:
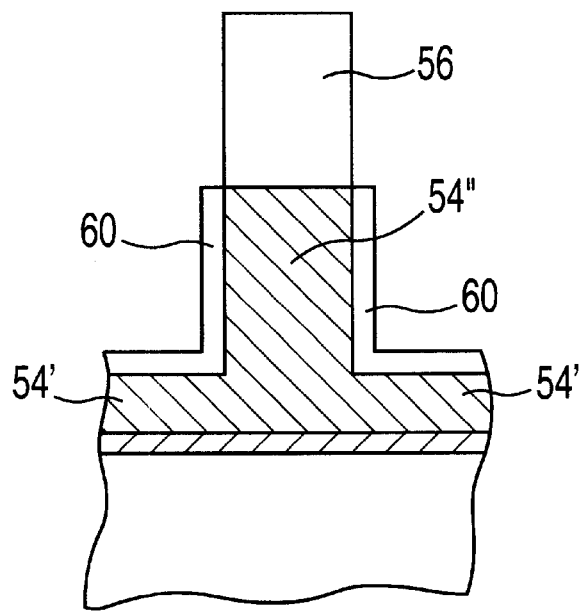

Following the above-mentioned partial etching of the gate conductor layer, passivating film 60 is formed at least on substantially vertical sidewalls 58 of the previously formed conductive feature 54". In some embodiments of the present invention, the passivating film may also be formed on thinned conductive layer 54'. The structure including passivating film 60 on substantially vertical sidewalls 58 and the horizontal surface of thinned gate conductor layer 54' is shown, for example, in FIG. 2C.

The passivating film employed in the present invention includes any number of standard C-containing and/or Si-containing films which is capable of adhering to the substantially vertical sidewalls of the gate conductor material, and is resistant to removal by a subsequent etching step of the present invention. The basics of this disclosure do not preclude any choice of passivating material, provided it can be deposited in the same tool that is used for gate conductor etch. For example, by adjusting the ratio of $O_2$, HBr and/or $Cl_2$ from the base plasma for a short period, or by introduction of another material, such as $CCl_4$, $C_2F_6$, or any other carbon-containing or Si-containing feedstock, passivating film 60 can be formed. An important feature of the invention is that gate conductor etch mentioned above is performed in a decoupled plasma tool, such that the wafer bias can be turned off while the plasma is still sustained, allowing for deposition of the passivating film with little sputtering component. This deposition of the passivating film will typically be at much lower temperatures than that used for oxidation, reducing the thermal budget of the integration. Additionally, the deposition of the passivating film occurs relatively independently of the gate conductor doping, whereas the oxidation rate may be dependent on the doping of the gate conductor. By using the in-situ deposition method of the present invention notches will form independently of the gate conductor doping.

The term C-containing film, which may or may not be polymeric, is used herein to denote films that comprise C and at least one of Cl, Br, O, Fl and/or H. The term Si-containing film, which may or may not be polymeric, is used herein to denote films that comprises Si and at least one of Cl, Br, Fl, O and/or H. The Si—C-containing films, which also may or may not be polymeric, include Si and C, and at least one of Cl, Br, Fl, O, and/or H. Combinations of these films, i.e., multilayers thereof, are also contemplated herein.

The thickness of the passivating film may vary depending on the type of polymeric material employed as well as the process that is employed in forming the same. Typically, the thickness of the passivating film is from about 2.0 to about 15 nm, with a thickness of from about 3.0 to about 5.0 nm being more highly preferred.

Figure 2D:
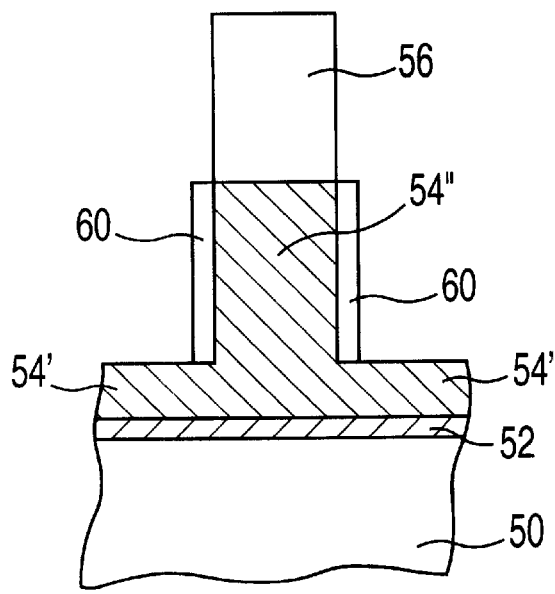

In embodiments wherein the passivating film is formed on the thinned conductive layer, an anisotropic etching process such as a conventional high-bias anisotropic plasma is used for breaking through and removing the passivating layer that is present on the horizontal thinned conductive layer. It is noted that the anisotropic etching process employed in this step of the present invention removes only the passivating film that is formed on the horizontal surface of the thinned conductive layer, i.e., it is selective to open the passivating film anisotropically. The anisotropic etching step does not, however, remove the passivating film from the substantially vertical sidewalls of the conductive feature. The structure formed after this etching step is shown, for example, in FIG. 2D. Note that when the passivating film is formed on only the substantially vertical sidewalls of the conductive feature, this step may be omitted. Note that this etching step can be performed in-situ, without having to remove the wafer to a separate chamber.

The next step of the present invention comprises an isotropic etching process that removes the remaining thinned conductive layer not protected by the mask exposing a lower portion of the conductive feature not containing the passivating film, while simultaneously removing notched regions in the lower portion of the conductive feature. The resultant structure including notched region 62 is shown, for example, in FIG. 2E. Note that notched region 62 is formed using an isotropic etching process that is selective to both the gate dielectric and the passivating film. In general, the isotropy lends itself to a very specific chemical attack of the gate conductor material only. This etching step may also be performed in-situ so that the wafer is never removed from vacuum during the entire fabrication of the notched gate structure. The isotropic etch may also be charge free to prevent the gate oxide charging or tunneling.

In one embodiment of the present invention, this etching step employs a high-pressure (e.g., a pressure of from about 20 to about 100 mTorr) $HBr/Cl_2/O_2/N_2$ isotropic plasma to form notched region 62. Although various conditions may be employed in the $HBr/Cl_2/O_2/N_2$ isotropic etch, the following represent some preferred conditions that may be employed in the present invention: HBr flow rate of approximately 150 sccm; $Cl_2$ flow rate of approximately 20 sccm;

$O_2$ flow rate of approximately 2.5 sccm; and $N_2$ flow rate of approximately 3–5 sccm; source power of about 500 to about 1000 watts; and an ultra low wafer-biased power of from about 0 to about 70 watts.

In another embodiment of the present invention, chlorine is not used in the isotropic etching of the notched gates. It is noted that plasmas that do not contain chlorine as an etchant maintain the integrity of the gate stack region.

Figure 2E:
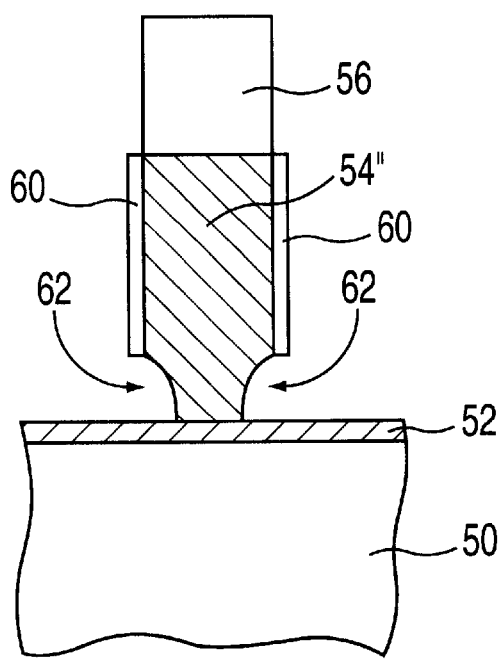

As stated above, this etching step is used for etching away the remaining thinned conductive layer to form the gate structure illustrated in FIG. 2E, while simultaneously forming a notch into the gate line below the remaining sidewall passivating film to form the notched regions at the bottom portion of the conductive feature.

Note that halogen species are typically employed in this etching step since they are capable of etching the conductive layer as well as forming the notched features. Nitrogen gases are also typically employed in this etching step since they reduce the etch loading effect, and also slow down the lateral etch rate during the notch formation etch process. Although nitrogen is a preferred gas, other inert gases such as helium or argon might possibly perform the same functions.

A conventional angle implant may be performed at this stage of the present invention to form source/drain extension regions in the substrate at the foot of the notched gate region.

The invention achieves a high level of control and is much more cost effective because all of the processing is done in one chamber by taking advantage of the decoupled plasma sources used for gate conductor etching. The passivation of the sidewall of the partially formed gate structure is important in this sequence. The passivated sidewall of the $n^+$ doped structure would not be subject to erosion during the further etch and over etch steps. The $n^+$ structure without passivation is particularly vulnerable during the over etch.

This invention teaches a method whereby notches can be reliably formed in both n- and p-type doped gates on a single wafer. As discussed above, the notched gate reduces the gate length dimension at the interface that exists between the gate conductor and gate dielectric, thereby providing improved device performance.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention is not limited to the exact forms and details described and illustrated, but fall within the scope of the appended claims.

Having thus described our invention in detail, what we claim as new and desire to secure by the letters patent is:

1. A method of forming a notched gate structure comprising the steps of:
   (a) forming a gate conductor layer having a first thickness on a surface of a gate dielectric;
   (b) forming a patterned mask over a portion of said gate conductor layer;
   (c) etching said gate conductor layer in regions not protected by said patterned mask to a reduced thickness, wherein said reduced thickness is less than said first thickness;
   (d) forming a passivating film over at least exposed vertical portions of said gate conductor layer, said passivating film comprises a C-containing film, a Si-containing film, a Si—C-containing film or combinations thereof; and
   (e) etching said gate conductor layer having reduced thickness and said conductor layer protected by said patterned mask to form undercut notches within said gate conductor layer at lower corners of said gate conductor layer that is beneath said patterned mask and said passivating film.

2. The method of claim 1 wherein said gate conductor layer is formed by a deposition process.

3. The method of claim 1 wherein said gate conductor layer is a conductive material selected from the group consisting of elemental metals, alloys of elemental metals, silicides of elemental metals, nitrides of elemental metals, doped or undoped polysilicon and combinations or multilayers thereof.

4. The method of claim 3 wherein said gate conductive layer is comprised of doped polysilicon.

5. The method of claim 1 wherein said gate dielectric is an oxide, nitride, oxynitride or combinations and multilayers thereof.

6. The method of claim 1 wherein said gate dielectric is formed on a surface of a semiconductor substrate.

7. The method of claim 1 wherein said patterned mask is formed by deposition, lithography and etching.

8. The method of claim 1 wherein said patterned mask is comprised of an oxide, nitride, oxynitride or combinations and multilayers thereof.

9. The method of claim 1 wherein said patterned mask is comprised of a photoresist which is formed by deposition and lithography.

10. The method of claim 1 wherein step (c) comprises an anisotropic etching process.

11. The method of claim 10 wherein said anisotropic etching process includes the use of a halogen-containing plasma.

12. The method of claim 11 wherein said halogen-containing plasma comprises $HBr/O_2$.

13. The method of claim 1 wherein said passivating layer is a material that is capable of adhering to said exposed vertical sidewalls and is resistant to removal by etching step (e).

14. The method of claim 1 wherein said C-containing film comprises C and at least one of Cl, Br, Fl, O, or H.

15. The method of claim 1 wherein said Si-containing film comprises Si and at least one of Cl, Br, Fl, O, or H.

16. The method of claim 1 wherein said Si—C-containing film comprises Si and C, and at least one of Cl, Br, Fl, O, or H.

17. The method of claim 1 wherein said passivating film is formed by a deposition process.

18. The method of claim 1 wherein said passivating film is also formed on exposed horizontal surfaces of said gate conductor layer of reduced thickness.

19. The method of claim 18 wherein said passivating film on said exposed horizontal surfaces is removed by an anisotropic etching process.

20. The method of claim 1 wherein step (e) includes an isotropic etching process.

21. The method of claim 20 wherein said isotropic etching process includes a high pressure $HBr/Cl_2/O_2/N_2$ plasma or a plasma that does not include $Cl_2$.

22. A method of forming a notched gate structure comprising the steps of:
   (a) forming a gate conductor layer on a gate dielectric layer, said gate conductor layer having a first thickness;
   (b) forming a patterned mask over said gate conductor layer;
   (c) etching said gate conductor layer in regions not protected by said patterned mask to a reduced thickness, wherein said reduced thickness is less than said first thickness;

(d) depositing a passivating film on exposed surfaces of said gate conductor layer, said passivating film comprises a C-containing film, a Si-containing film, a Si—C-containing film or combinations thereof;

(e) removing said passivating film from horizontal portions of said gate conductor layer; and (f) selectively etching said gate conductor layer to remove said gate conductor layer from regions not protected by said patterned mask, thereby forming undercut notches within said gate conductor layer at corner locations where said gate conductor meets said gate dielectric layer.

23. A method of forming a plurality of n-type and p-type notched gates on a single wafer comprising the steps of:

(a) forming a gate conductor layer having a first thickness on a gate dielectric;

(b) forming a patterned mask over a portion of said gate conductor layer;

(c) etching said gate conductor layer in regions not protected by said patterned mask to a reduced thickness, wherein said reduced thickness is less than said first thickness, (c) forming a passivating film over at least vertical portions of said gate conductor layer, said passivating film comprises a C-containing film, a Si-containing film, a Si—C-containing film or combinations thereof; and (d) forming undercut notches within said gate conductor layer at lower corners of said gate conductor layer.

24. A method of forming a notched gate structure comprising the steps of:

(a) forming a gate conductor layer on a gate dielectric, said gate conductor layer having a first thickness;

(b) patterning a mask over said gate conductor layer;

(c) etching said gate conductor layer in regions not protected by said mask to a reduced thickness, wherein said reduced thickness is greater than zero and less than said first thickness;

(d) depositing a passivating film on exposed surfaces of said gate conductor layer, said passivating film comprises a C-containing film, a Si-containing film, a Si—C-containing film or combinations thereof;

(e) removing said passivating film from horizontal portions of said gate conductor layer using an anisotropic etch; and (f) selectively etching said gate conductor layer to remove said gate conductor layer from all regions not protected by said mask and said passivating film, thereby forming undercut notches within said gate conductor layer at corner locations where said gate conductor meets said gate dielectric.

* * * * *